(12) United States Patent
Tokita et al.

(10) Patent No.: US 7,821,125 B2
(45) Date of Patent: Oct. 26, 2010

(54) SEMICONDUCTOR DEVICE

(75) Inventors: Shigeru Tokita, Yokohama (JP); Hiroo Matsue, Yokohama (JP); Fumihide Maeda, Odawara (JP)

(73) Assignee: OpNext Japan, Inc., Kanagawa (JP)

( * ) Notice: Subject to any disclaimer, the term of this patent is extended or adjusted under 35 U.S.C. 154(b) by 157 days.

(21) Appl. No.: 12/109,417

(22) Filed: Apr. 25, 2008

(65) Prior Publication Data
US 2009/0039503 A1 Feb. 12, 2009

(30) Foreign Application Priority Data
Jun. 8, 2007 (JP) .............................. 2007-153103

(51) Int. Cl.
*H01L 21/12* (2006.01)
(52) U.S. Cl. ................... 257/711; 257/685; 257/708; 257/717; 257/E23.101
(58) Field of Classification Search ................. 257/685, 257/708, 711, 717, E23.101, E33.056, E21.499
See application file for complete search history.

(56) References Cited
U.S. PATENT DOCUMENTS
6,087,682 A * 7/2000 Ando .......................... 257/178

7,514,784 B2 * 4/2009 Mayuzumi et al. .......... 257/712

FOREIGN PATENT DOCUMENTS
| JP | 2001-068607 | 3/2001 |
|---|---|---|
| JP | 2004-259977 | 9/2004 |
| JP | 2006-261336 | 9/2006 |

* cited by examiner

Primary Examiner—N Drew Richards
Assistant Examiner—Joannie A Garcia
(74) Attorney, Agent, or Firm—Brundidge & Stanger, P.C.

(57) ABSTRACT

The invention provides a heat radiating structure which reduces a mechanical stress applied to an electronic part mounted on a printed circuit board including a semiconductor package. The heat radiating structure is constructed by a semiconductor package mounted on a printed circuit board, a thermal conduction sheet arranged on an upper surface of the semiconductor package, and a metal case provided with a heat radiating fin for receiving a heat transmitted form the thermal conduction sheet so as to discharge to an atmospheric air, and the metal case is provided with a concavo-convex structure in a contact portion with the thermal conduction sheet.

5 Claims, 8 Drawing Sheets

SEMICONDUCTOR DEVICE

The present application claims priority from Japanese application JP 2007-153103 filed on Jun. 8, 2007, the content of which is hereby incorporated by reference into this application.

BACKGROUND OF THE INVENTION (1) Field of the Invention

The present invention relates to a semiconductor device, and more particularly to a technique which is effectively applied to a semiconductor device provided with a heat radiating structure.

(2) Description of Related Art

JP-A-2006-261336 (patent document 1) discloses a technique forming a heat radiating structure for heat radiating an electronic device by using a thermal conduction sheet formed as a sheet shape by an elastic material in which a surface has an adhesive property, covering one surface of the thermal conduction sheet by a perforated sheet, sticking the other surface to the electronic device, pressing a heat radiating thread to the perforated sheet, and pushing out the surface of the elastic material of the heat conduction sheet from a hole of the perforated sheet on the basis of a pressing so as to stick the heat radiating thread and the thermal conduction sheet.

JP-A-2004-259977 (patent document 2) discloses a technique that a thermal conduction member is deformed so as to relax a stress between a casing and a semiconductor chip by accommodating a substrate mounting the semiconductor chip thereon in the sealed casing, forming a structure pinching the thermal conduction member to a gap between the semiconductor chip and an inner wall of the casing, and providing a structure having concavity and convexity at least in one of a portion opposing to the semiconductor chip in the inner wall of the casing and the semiconductor chip.

JP-A-2001-68607 (patent document 3) discloses a technique suppressing a deflection of a circuit board generated by a load applied to the circuit board by compressing a soft high thermal conduction body at a time of interposing the high thermal conduction body between the circuit board and a heat radiating plate so as to heat radiate.

FIGS. 8 and 9 are cross sectional views showing a heat radiating structure in an optical transmitter and receiver (an optical transmission module) considered by the inventors of the present invention, and respectively show different cross sections. The heat radiating structure shown in FIGS. 8 and 9 is constituted by a semiconductor package 102 mounted on a printed circuit board 101, a thermal conduction sheet 103 arranged on an upper surface of the semiconductor package 102, and a metal case 105 provided with a heat radiating fin 104 radiating a heat transmitted from the thermal conduction sheet 103 to an atmospheric air.

The thermal conduction sheet 103 employs a sheet having an adhesive property on a surface which comes into contact with the semiconductor package 102 and the metal case 105, and having an elasticity in such a manner that a thickness is changed in correspondence to a gap between the semiconductor package 102 and the metal case 105.

In the example shown in FIGS. 8 and 9, there is shown the semiconductor package 102 having a ball grid array structure using a solder ball in a connection portion to the printed circuit board 101.

In accordance with one example of an assembling procedure of the heat radiating structure shown in FIGS. 8 and 9, the heat radiating structure is assembled by screw fixing the printed circuit board 101 to which the semiconductor package 102 is connected by a solder to a metal case 106 forming a pair together with the metal case 105 by using a screw 107 and a screw 108, arranging the thermal conduction sheet 103 on the upper surface of the semiconductor package 102, and thereafter putting the metal case 105 provided with the heat radiating fin 104 thereon so as to fix to the metal case 106 by a screw 109 and a screw 110. The screw 109 and the screw 110 are fitted to a through hole 111 provided in the metal case 105 and a thread hole 112 provided in the metal case 106, whereby the metal case 105 and the metal case 106 are fixed.

A gap between the metal case 105 and the semiconductor package 102 becomes narrow at a time of fixing the metal case 105 provided with the heat radiating fin 104 to the metal case 106 by the screw 109 and the screw 110. The thermal conduction sheet 103 is adjusted to a thickness corresponding to the gap between the metal case 105 and the semiconductor package 102 by utilizing an elasticity of the thermal conduction sheet 103 itself.

There is a case that a thickness of the thermal conduction sheet 103 can not be rapidly changed in the case that an environmental (atmospheric) temperature is low or in some pressurizing speed caused by a screwing even if the elasticity is provided. In the case that the heat radiating structure shown in FIGS. 8 and 9 is assembled under the condition mentioned above, the pressure applied from the metal case is not relaxed by the thermal conduction sheet 103, and a mechanical stress is applied to the semiconductor package 102. If an excessive mechanical stress is applied to the semiconductor package 102, there is a risk of breaking the semiconductor package 102 and the connection portion between the semiconductor package 102 and the printed circuit board 101. Further, since the mechanical stress is transmitted to the printed circuit board 101, a strain is generated in the printed circuit board 101, and there is a risk of damaging the surface mounted parts mounted around the semiconductor package 102 such as a resistance, a condenser and the like.

The thermal conduction sheet 103 goes on keeping an elastic stress generated at a time of assembling after a time elapse except just after assembling the heat radiating structure shown in FIGS. 8 and 9. On the basis of the elastic stress, the mechanical stress is continuously applied to the semiconductor package 102 and the printed circuit board 101 for a long time period, and there is a risk of deteriorating a characteristic and lowering a service life of the surface mounted parts mounted on the printed circuit board 101 including the semiconductor package 102.

A graph shown by a solid line in FIG. 10 corresponds to one example of a characteristic view showing a change with time of the mechanical stress applied to the semiconductor package 102 in the case of pressurizing the thermal conduction sheet 103 by the metal case 105 in the heat radiating structure shown in FIGS. 8 and 9. A vertical axis of the graph in FIG. 10 indicates the mechanical stress applied to the semiconductor package 102, and a horizontal axis indicates a time on the basis of a logarithmic display.

In the case of rapidly pressurizing the thermal conduction sheet 103 by the metal case 105, since the thermal conduction sheet 103 can not follow the rapid change, the mechanical stress is applied to the semiconductor package 102 without being relaxed. A rapid increase of the mechanical stress is expressed in the graph in FIG. 10. Since the thermal conduction sheet 103 thereafter familiarizes itself with the pressure, the mechanical stress is slowly reduced in accordance with a time elapse, however, the mechanical stress is continuously applied to the semiconductor package 102 on the basis of a residual stress of the thermal conduction sheet 103, although it is smaller than the mechanical stress at a time of pressurizing.

FIG. 11 shows an example of a heat radiating structure considered by the inventors of the present invention as a technique suppressing the mechanical stress generated by the heat radiating structure shown in FIGS. 8 and 9. The heat radiating structure shown in FIG. 11 employs a heat conduction sheet 113 in which a concavo-convex structure is provided in the surface. The thermal conduction sheet 113 is structured such that the concavo-convex structure is provided on a surface of the thermal conduction sheet 103 by embossing the concavo-convex structure on the thermal conduction sheet 103 having the flat surface used in the heat radiating structure shown in FIGS. 8 and 9 by using a mold having concavity and convexity, as shown in FIG. 12.

In the heat radiating structure using the thermal conduction sheet 113 shown in FIG. 11, even in the case that the metal case 105 is fixed by the screws 109 and 110, the excessive mechanical stress is hard to be applied to the electronic part mounted on the printed circuit board 101 including the semiconductor package 102 on the basis of the collapse of the concavo-convex structure of the surface provided in the thermal conduction sheet 113.

However, since the thermal conduction sheet 113 shown in FIG. 11 is provided with the concavo-convex structure on the surface, there is a hard handled point such as a strength of the concave portion is weak and the concave portion is scattered at a time of gripping the thermal conduction sheet. The concavo-convex structure tends to collapse at a time of gripping the thermal conduction sheet by a finger, tweezers or the like, and there is a case that the mechanical stress at a time of assembling the optical transmission module can not be relaxed in this state.

In the case of the technique disclosed in JP-A-2004-259977 (patent document 2), since the structure is made such that the concavity and convexity are formed at least one of the portion opposing to the semiconductor chip in the inner wall of the casing and the semiconductor chip, there is a case that an air is sealed between the concavity and convexity and the thermal conduction member if the thermal conduction member is warped. In the case that the air is sealed as mentioned above, there is a risk that an adhesiveness with the thermal conduction member is lowered, or a heat radiating performance is lowered.

In the case of the technique disclosed in JP-A-2001-68607 (patent document 3), since the structure is made such that the through hole is provided in the heat radiating plate, there is a risk that a work for forming the through hole becomes hard. Even in the case that the through hole is provided, there is a risk that the heat radiating fin can not be provided in the heat radiating plate due to the structure of the heat radiating plate. Further, there is a risk that an electromagnetic wave leaks out to an external portion from the through hole. Further, in the case that the optical transmitter and receiver is arranged in the device such as a rooter or the like, there is a risk that the other parts within the device are erroneously actuated by the leaking electromagnetic wave. Further, there is a risk that a foreign material enters into the optical transmitter and receiver from the through hole.

BRIEF SUMMARY OF THE INVENTION

An object of the present invention is to provide a heat radiating structure which reduces a mechanical stress applied to an electronic part mounted on a printed circuit board including a semiconductor package.

In the inventions disclosed by the present application, an outline of representative inventions will be briefly described as follows.

In accordance with the present invention, there is provided a semiconductor device having a mounting board, a semiconductor package mounted on the mounting board, a metal case accommodating and fixing the mounting board and the semiconductor package in an inner portion, and a thermal conduction sheet arranged between the semiconductor package and the metal case, coming into contact with the semiconductor package and the metal case, and radiating a heat generated from the semiconductor package, wherein the thermal conduction sheet has an elasticity by which a stress is relaxed with time with respect to a pressure, the metal case is provided with a plurality of concave portions and convex portions in a contact portion with the thermal conduction sheet, and a plurality of concave portions are formed at two or more different depths.

In the semiconductor device in accordance with the present invention, it is preferable that a plurality of convex portions are sharp toward the thermal conduction sheet.

Further, in the semiconductor device in accordance with the present invention, it is preferable that a plurality of concave portions include a first concave portion having a first depth and a second concave portion having a second depth which is deeper than the first depth, a part or less of the metal case comes into contact with the thermal conduction sheet within the second concave portion, and an air gap is formed between the metal case and the thermal conduction sheet.

Further, in the semiconductor device in accordance with the present invention, it is preferable that the second concave portion is formed as a groove shape and extends to an outer periphery of the contact portion between the metal case and the thermal conduction sheet, and the air gap is communicated with an external atmospheric air of the contact portion between the metal case and the thermal conduction sheet.

Further, in the semiconductor device in accordance with the present invention, it is preferable that the first concave portion and the second concave portion are formed along the contact portion between the metal case and the thermal conduction sheet, and the second concave portion is formed at least in one of a bottom portion of the first concave portion and a portion between the two first concave portions.

In the inventions disclosed by the present application, an effect obtained by the representative one will be briefly described as follows.

In other words, it is possible to relax the mechanical stress of the electronic part on the printed circuit board including the semiconductor package.

Other objects, features and advantages of the present invention will become apparent from the following description of the embodiments of the present invention taken in conjunction with the accompanying drawings.

DETAILED DESCRIPTION OF THE INVENTION

A description will be in detail given below of an embodiment in accordance with the present invention with reference to the accompanying drawings.

Figure 1:
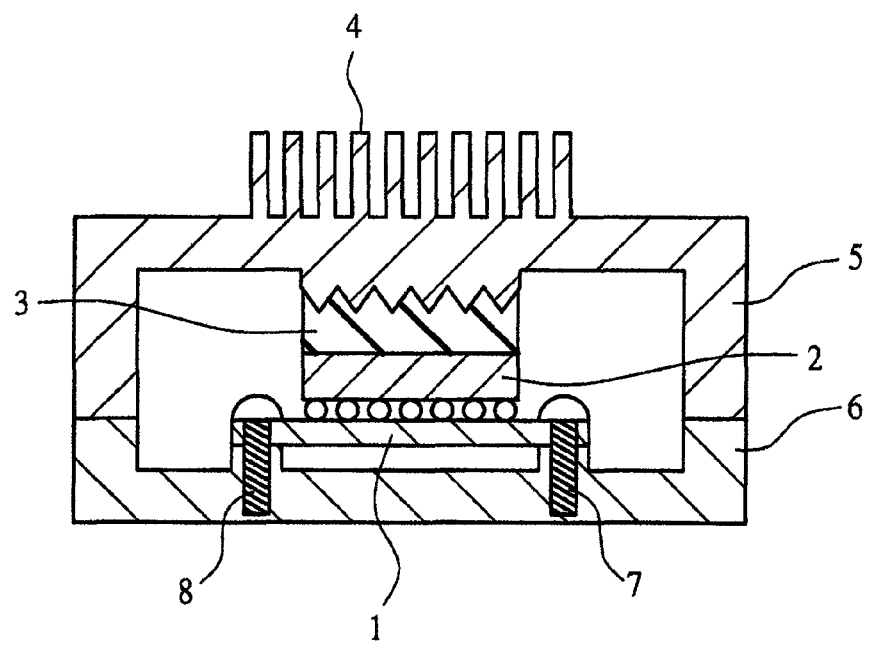
FIG. 1 is a cross sectional view showing a heat radiating structure in an optical transmitter and receiver corresponding to an embodiment in accordance with the present invention.
Figure 2:
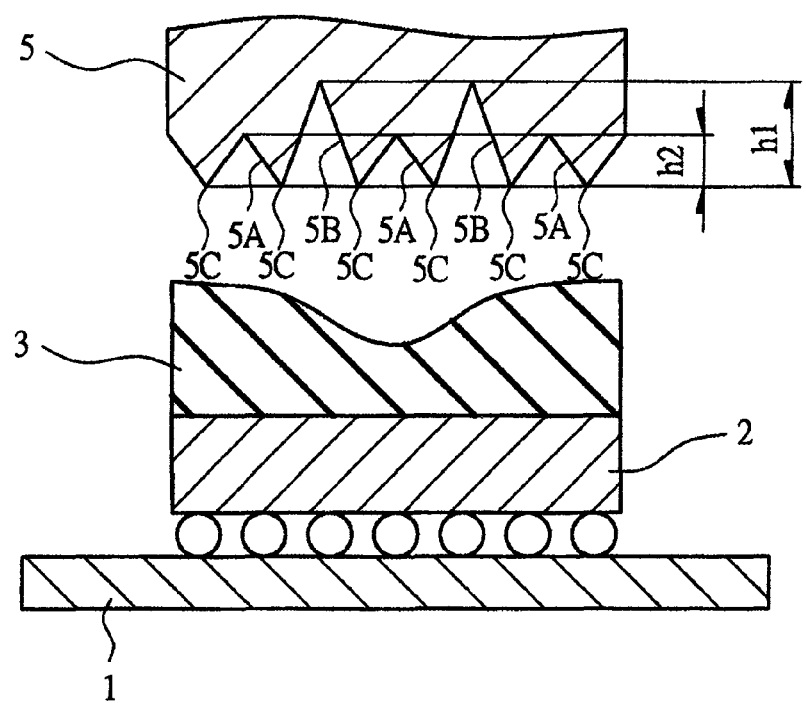
FIG. 2 is a cross sectional view showing a main portion in FIG. 1 in an enlarged manner.

FIG. 1 shows one cross section (a heat radiating structure) of an optical transmitter and receiver (an optical transmission module) in accordance with the present embodiment, and FIG. 2 shows a part thereof in an enlarged manner.

The heat radiating structure in the optical transmitter and receiver in accordance with the present embodiment shown in FIGS. 1 and 2 is constituted by a semiconductor package 2 mounted on a printed circuit board (a mounting board) 1, a thermal conduction sheet 3 arranged on an upper surface of the semiconductor package 2, and a metal case 5 provided with a heat radiating fin 4 for receiving a heat transmitted from the thermal conduction sheet 3 so as to discharge to an atmospheric air.

The thermal conduction sheet 3 employs a material having an adhesiveness on a surface which comes into contact with the semiconductor package 2 and the metal case 5, and having an elasticity in such a manner that a thickness is changed in correspondence to a gap between the semiconductor package 2 and the metal case 5, and is exemplified by a thermal conduction silicone (a silicone rubber) having a thickness about 2 mm to 5 mm, in the present embodiment.

The semiconductor package 2 has a ball grid array structure in which a solder ball is used in a connection portion to the printed circuit board 1.

The optical transmitter and receiver shown in FIGS. 1 and 2 can be assembled, for example, in accordance with the following procedure. In other words, the printed circuit board 1 to which the semiconductor package 2 is connected by solder is screw fixed to a metal case 6 forming a pair together with the metal case 5 by using a screw 7 and a screw 8, the thermal conduction sheet 3 is arranged on an upper surface of the semiconductor package 2, the metal case 5 provided with the heat radiating fin 4 is thereafter put thereon, and the metal case 5 and the metal case 6 are fixed by a screw which is not shown in FIG. 1.

A gap between the metal case 5 and the semiconductor package 2 becomes narrow at a time of fixing the metal case 5 provided with the heat radiating fin 4 to the metal case 6. The thermal conduction sheet 3 is adjusted to a thickness corresponding to the gap between the metal case 5 and the semiconductor package 2, by utilizing an elastic force of the thermal conduction sheet 3 itself.

Figure 3:
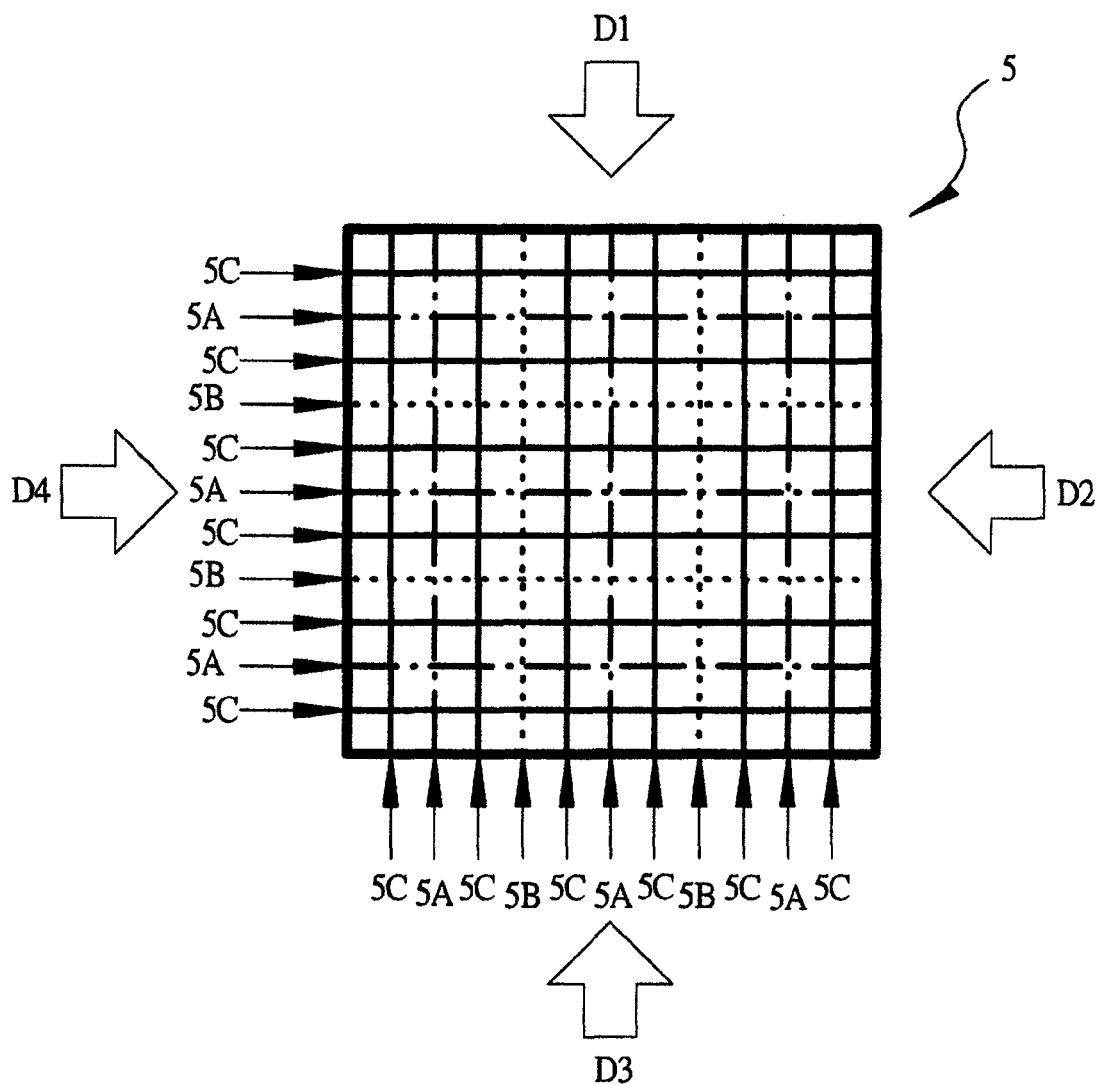
FIG. 3 is a plan vie of a main portion of a metal case in the optical transmitted and receiver in accordance with the embodiment of the present invention.

As shown in FIG. 2, the metal case 5 is characterized in that the contact portion with the thermal conduction sheet 3 is formed as a projection shape, and a concavo-convex structure (a plurality of concave portions 5A and 5B and a convex portions 5C) is provided in a leading end of the projection portion. A depth (a second depth) h1 of the concave portion (the second concave portion) 5B is formed deeper than a depth (a first depth) h2 of the concave portion (the first concave portion) 5A. The present embodiment is exemplified by setting the depth h1 of the concave portion 5B to about 3 mm, and setting the depth h2 of the concave portion 5A to about 1 mm. In this case, each of the depth h1 of the concave portion 5B and the depth h2 of the concave portion 5A corresponds to a depth from a leading end of the convex portion 5C. In this case, the leading end of the convex portion 5C is formed as a shape which is sharp toward the thermal conduction sheet 3. In this case, FIG. 3 is a plan view of the projection portion of the metal case 5 in which the concave portions 5A and 5B and the convex portions 5C are formed. In FIG. 3, a one-dot chain line indicates a deepest portion of the concave portion 5A, a dotted line indicates a deepest portion of the concave portion 5B, and a solid line (except a plan outline of the projection portion) indicates the leading end of the convex portion 5C. As shown in FIGS. 2 and 3, each of the concave portions 5A and 5B and the convex portions 5C is formed as a groove shape, and extends approximately as a grid shape to an outer periphery of the projection portion. In FIG. 3, there is illustrated the example in which the concave portions 5A and 5B and the convex portions 5C are formed approximately as the grip shape, however, may be formed in only one direction. Further, the cross section of the projection portion of the metal case 5 shown in FIG. 2 corresponds to a side surface as seen from any of directions D1, D2, D3 and D4 shown in FIG. 3.

Figure 4:
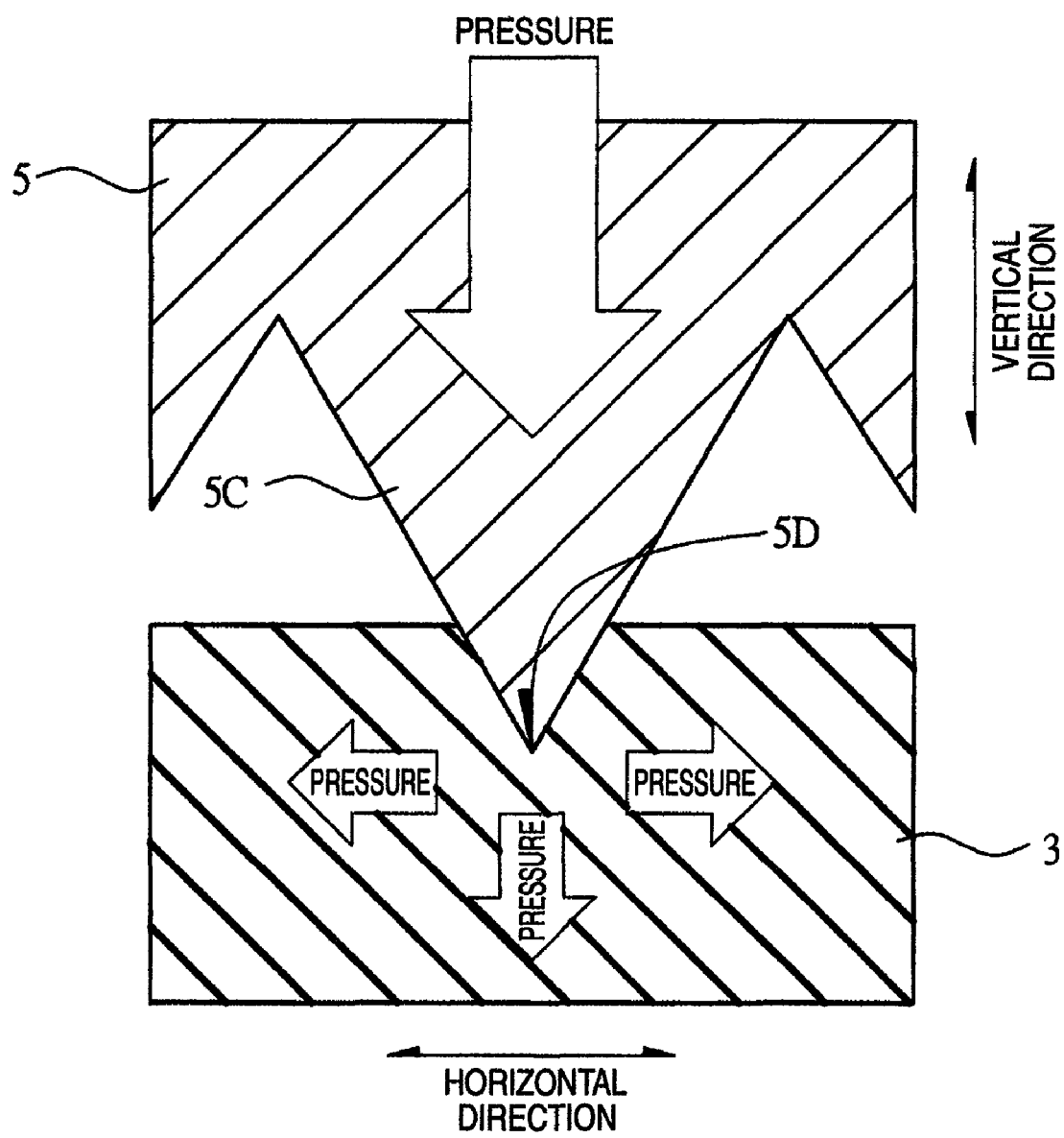
FIG. 4 is a schematic view showing an interface between a metal case and a thermal conduction sheet in an enlarged manner, in the heat radiating structure in the optical transmitter and receiver in accordance with the embodiment of the present invention.

FIG. 4 shows a schematic view showing the interface between the projection portion of the metal case 5 and the thermal conduction sheet 3 in an enlarged manner, and illustrates a dispersion of the pressure within the thermal conduction sheet 3 at a time of being pressurized by the concavo-convex structure (the convex portion 5C) in the leading end of the projection portion of the metal case 5.

As shown in FIG. 4, a part of the pressure in a vertical direction applied to the thermal conduction sheet 3 by the metal case 5 is converted into a force in a horizontal direction to the thermal conduction sheet 3 by the projection structure (the convex portion 5C). The force in the horizontal direction deforms the thermal conduction sheet 3 in the horizontal direction, generates a crack in the thermal conduction sheet 3 starting from the leading end 5D of the convex portion 5C in some degree of the force in the horizontal direction, and serves to reduce a repulsive force in the vertical direction. Further, even if the crack is generated in the thermal conduction sheet 3, the thermal conduction sheet 3 can be closely attached to the convex portion 5C even in this crack portion.

Figure 5:
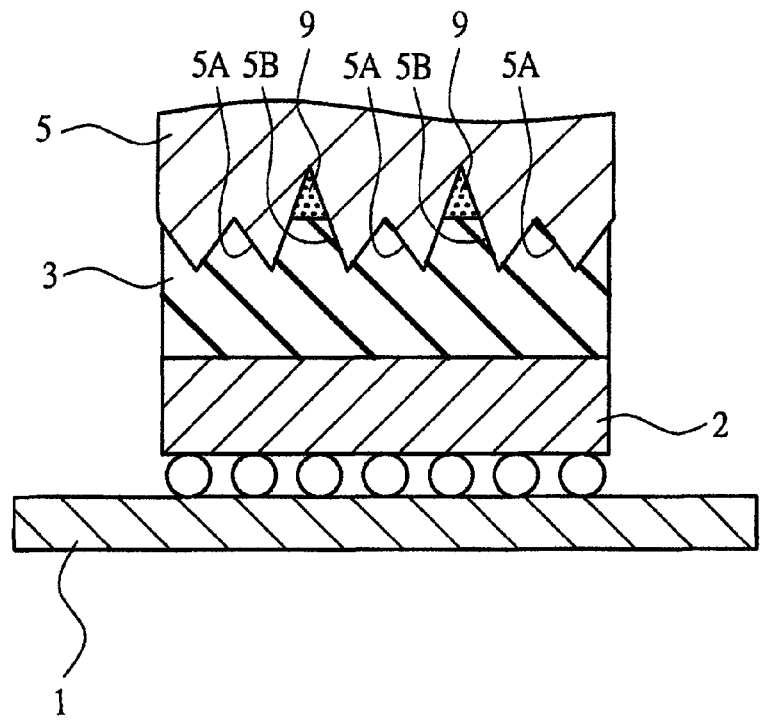
FIG. 5 is a cross sectional view of a main portion of the heat radiating structure in the optical transmitter and receiver in accordance with the embodiment of the present invention.

Further, as shown in FIG. 5, even after the metal case 5 and the thermal conduction sheet 3 are closely attached within the concave portion 5A, in a process that the thermal conduction sheet 3 is pressurized from the metal case 5, there is generated a state in which an air gap 9 is generated in a deeper region than the concave portion 5A, within the concave portion 5B. As mentioned above, since the concave portion 5B is formed as the groove shape extending to an outer periphery of the projection portion of the metal case 5, the air gap 9 extends to the outer periphery of the projection portion of the metal case 5, and is communicated with the external ambient atmosphere of the contact portion between the thermal conduction sheet 3 and the metal case 5. In other words, even in the case that the strain is generated in the thermal conduction sheet 3, in the process that the metal case 5 pressurizes the thermal conduction sheet 3, the air in the interface between the projection portion of the metal case 5 and the thermal conduction sheet 3 can be deaerated from the outer periphery of the projection portion of the metal case 5 through the air gap 9, and it is possible to prevent a problem that the air is sealed. Accordingly, it is possible to prevent the closely attaching characteristic between the projection portion of the metal case 5 and the thermal conduction sheet 3 and the heat radiating performance from being lowered.

Figure 6:
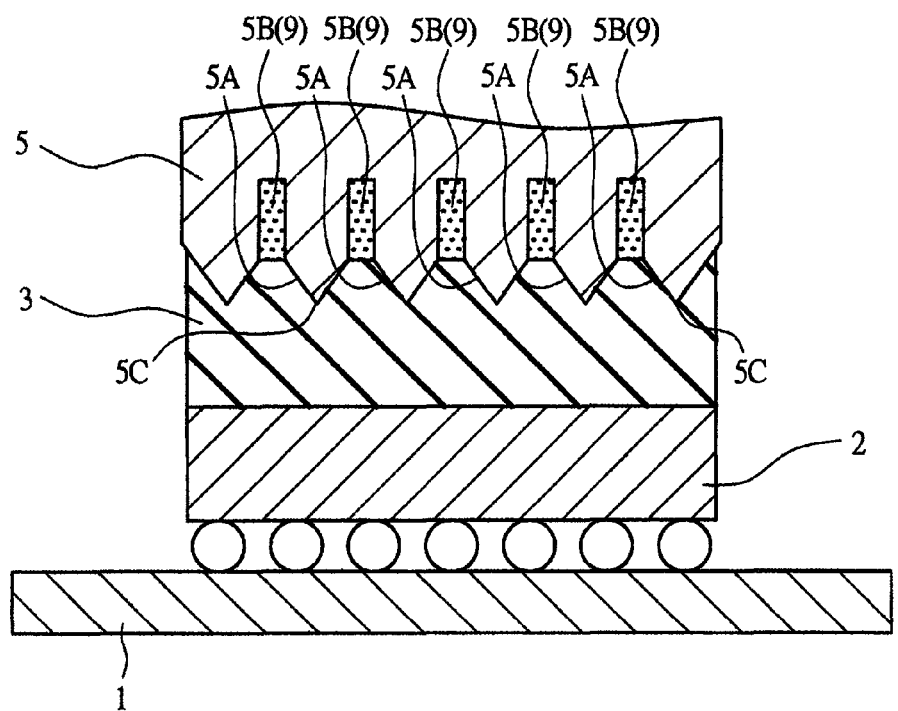
FIG. 6 is a cross sectional view of a main portion of the heat radiating structure in the optical transmitter and receiver in accordance with the embodiment of the present invention.

Further, as shown in FIG. 6, the concave portion 5B may be structured such as to be provided in a bottom portion of the concave portion 5A. At this time, a depth from a leading end of the convex portion 5C to a bottom portion of the concave portion 5B corresponds to the depth h1 of the concave portion 5B shown in FIG. 2 mentioned above. Even in the case that the concavo-convex structure of the leading end of the projection portion of the metal case 5 is set to the structure shown in FIG. 6, it is possible to obtain the same effect as that in the case of the concavo-convex structure shown in FIGS. 2 to 5.

The concavo-convex structure (the concave portions 5A and 5B and the convex portions 5C) shown in FIGS. 2 to 6 can be formed in a lump by using a metal mold at a time of manufacturing the metal case 5. Accordingly, since a working step for forming the concavo-convex structure is not independently necessary, it is possible to easily form the concavo-convex structure.

Further, the concavo-convex structure (the concave portions 5A and 5B and the convex portions 5C) shown in FIGS. 2 to 6 is not constituted by a through structure reaching the outer portion of the metal case 5.

Accordingly, it is possible to the electromagnetic wave from leaking out to the outer portion of the metal case 5, during the driving of the optical transmitter and receiver. As a result, even in the case that the optical transmitter and receiver is arranged in the device such as the rooter or the like, it is possible to prevent a problem that the other parts within the device are erroneously actuated by the leaking electromagnetic wave. Further, it is possible to prevent a problem that the foreign material enters into the optical transmitter and receiver.

In this case, in the present embodiment, there is illustrated (refer to FIGS. 2, 4, 5 and 6) the concavo-convex structure provided with the projection structure (the convex portion 5C) having the sharp leading end, however, the effect mentioned above can be expected in a projection structure including a needle shape or a blade shape having a columnar concavo-convex structure.

Figure 7:
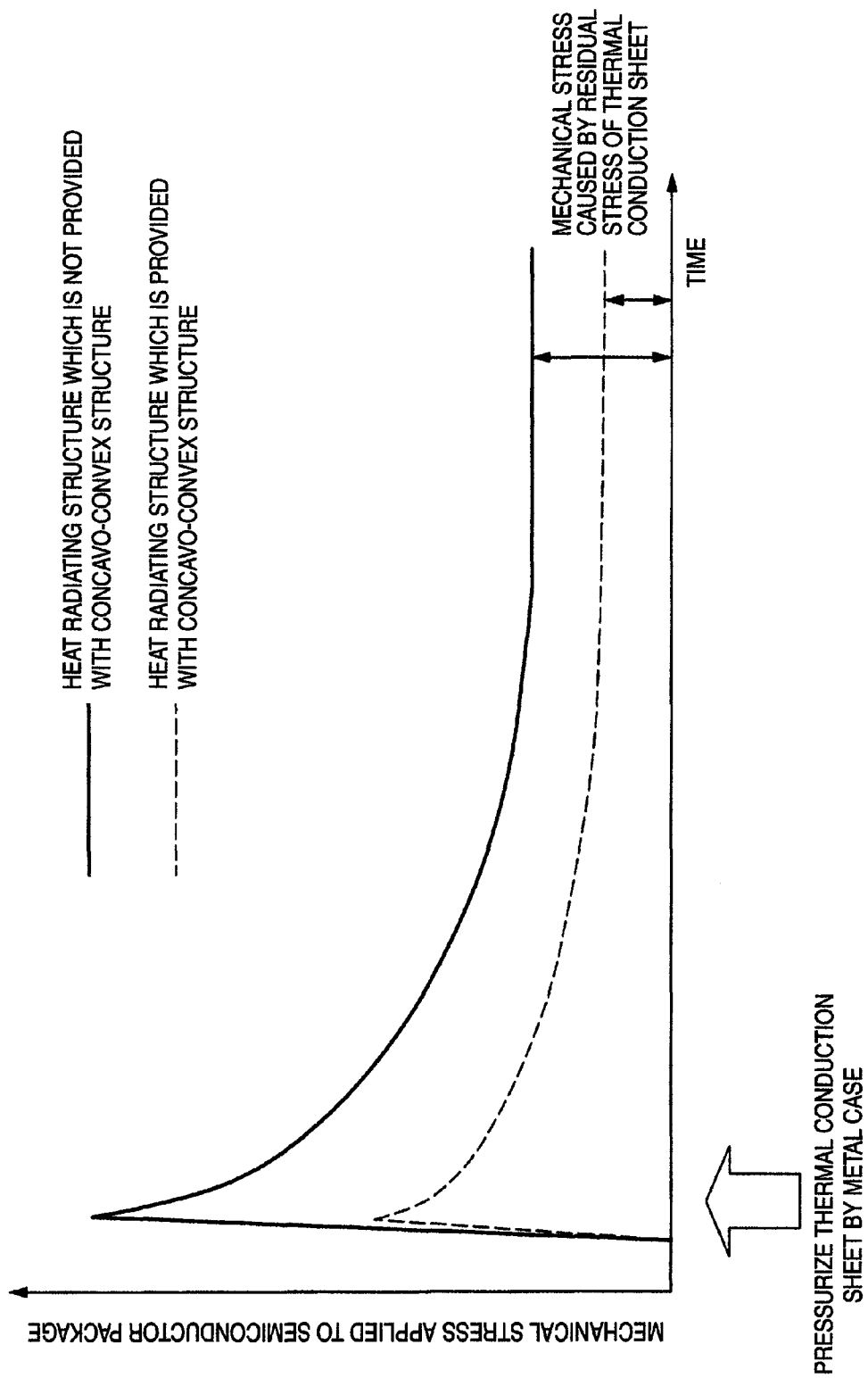
FIG. 7 is a characteristic view showing a change with time of a mechanical stress applied to a semiconductor package in the heat radiating structure of the optical transmitter and receiver in accordance with the embodiment of the present invention.
Figure 8:
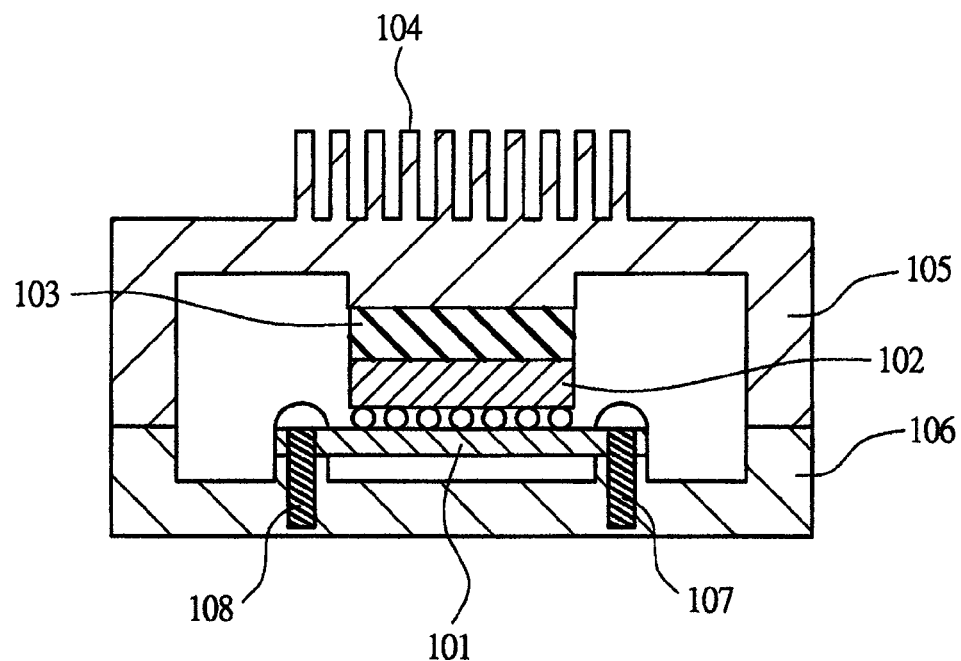
FIG. 8 is a cross sectional view showing a heat radiating structure in an optical transmitter and receiver considered by the inventors of the present invention.
Figure 9:
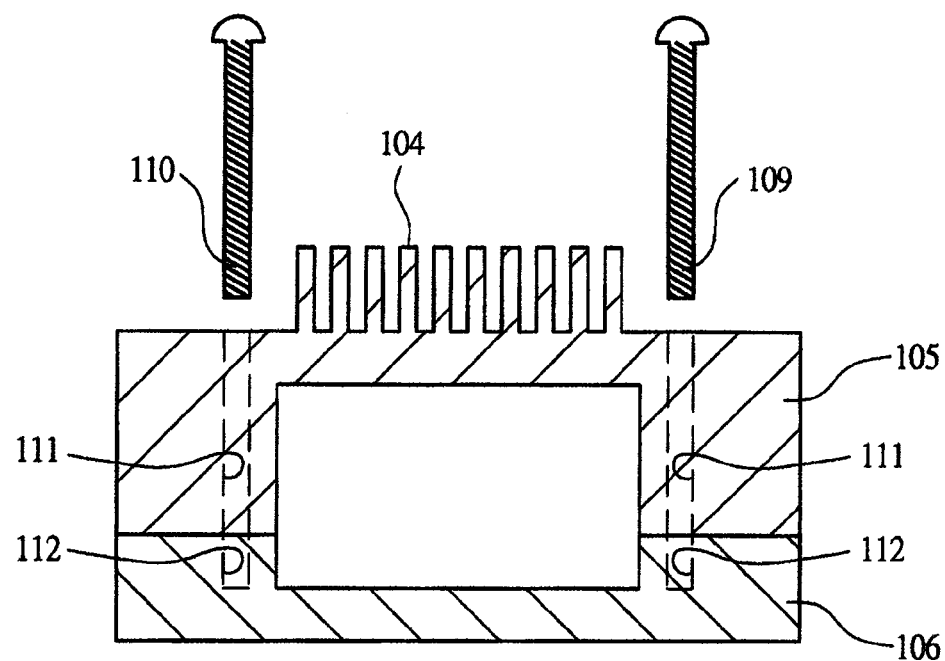
FIG. 9 is a cross sectional view showing the heat radiating structure in the optical transmitter and receiver considered by the inventors of the present invention.
Figure 10:
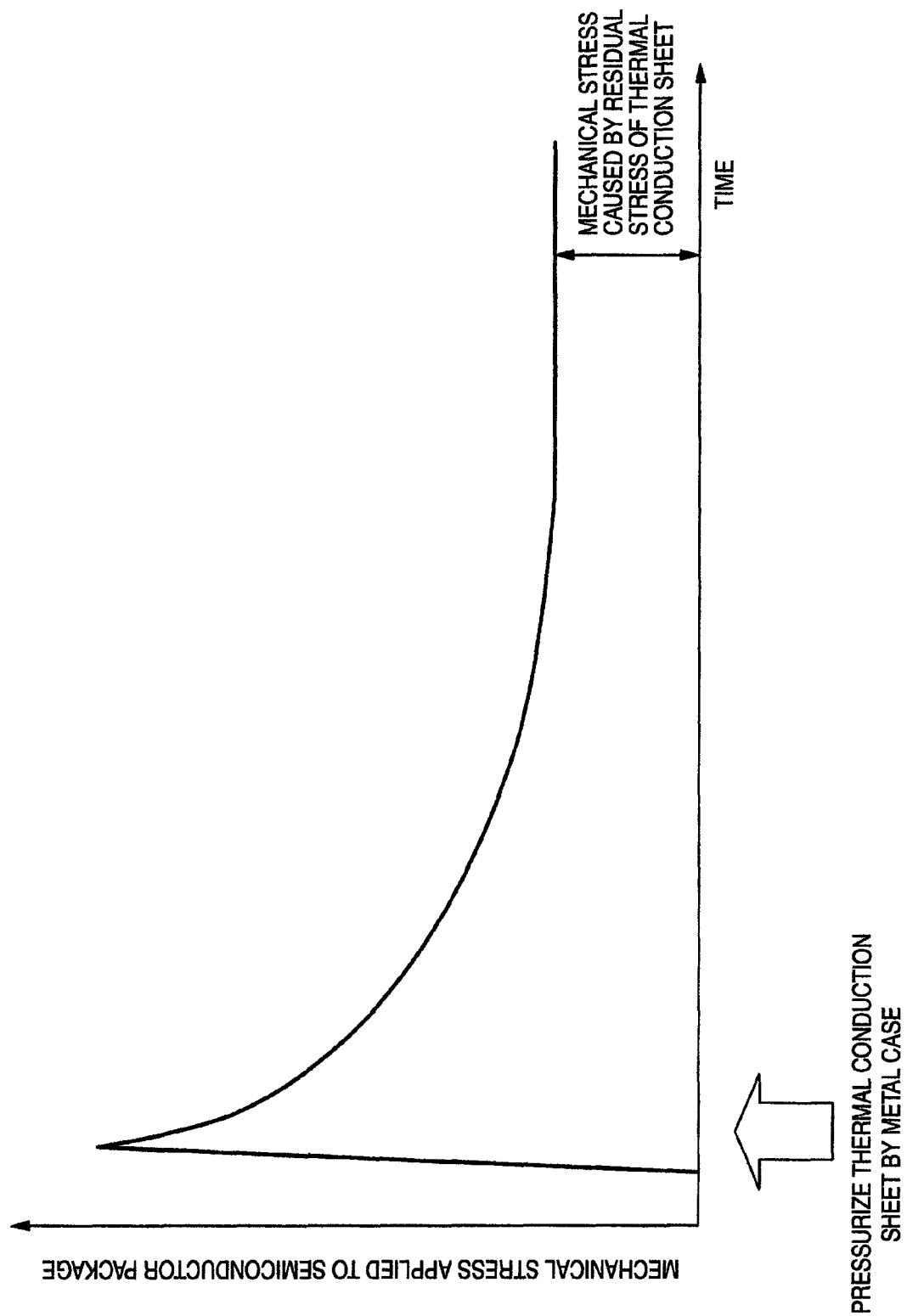
FIG. 10 is a characteristic view showing a change with time of a mechanical stress applied to a semiconductor package in the heat radiating structure of the optical transmitter and receiver considered by the inventors of the present invention.
Figure 11:
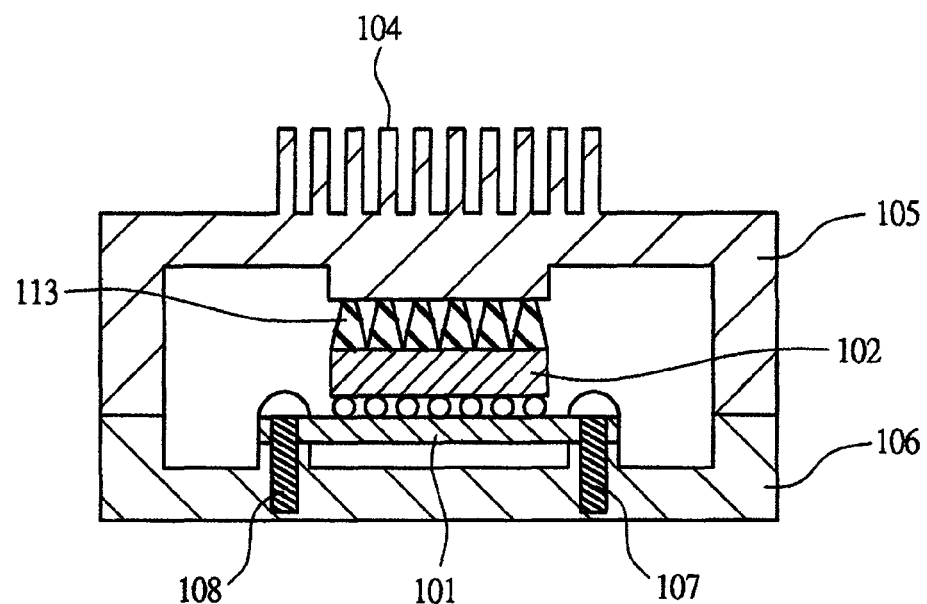
FIG. 11 is a cross sectional view showing a heat radiating structure in an optical transmitter and receiver considered by the inventors of the present invention.
Figure 12:
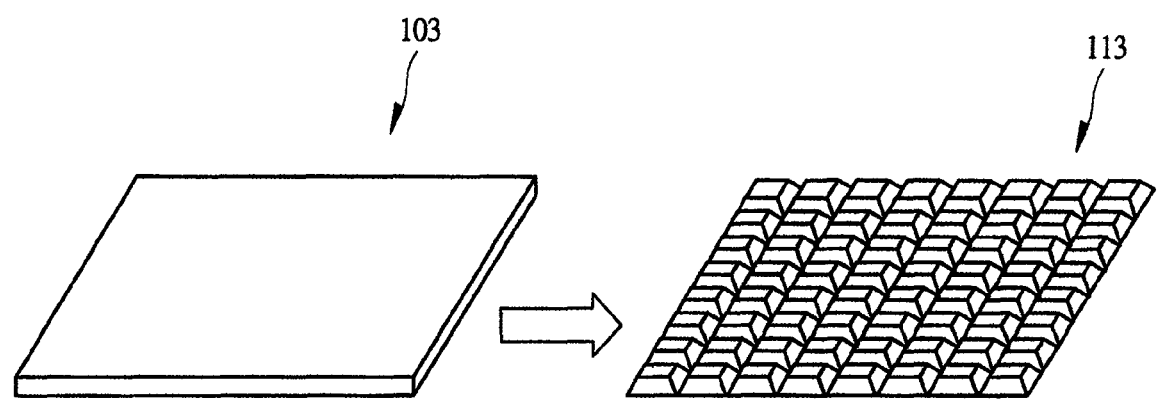
FIG. 12 is a perspective view explaining a working method of a thermal conduction sheet used in the heat radiating structure shown in FIG. 11.

FIG. 7 shows one example of a characteristic view indicating a change with time of the mechanical stress applied to the semiconductor package 2 at a time of pressurizing the thermal conduction sheet 3 by the metal case 5. In FIG. 7, a graph shown by a broken line indicates a case of the heat radiating structure (refer to FIGS. 2 to 6) provided with the concavo-convex structure (the concave portions 5A and 5B and the convex portion 5C) in accordance with the present embodiment, and a graph shown by a solid line indicates a case of the heat radiating structure which is not provided with the concavo-convex structure in accordance with the present embodiment.

In comparison with the characteristic of the heat radiating structure which is not provided with the concavo-convex structure and is shown by the solid line, the heat radiating structure provided with the concavo-convex structure in accordance with the present embodiment has a lower peak value of the mechanical stress, and has a faster change with time by which the mechanical stress is relaxed. This is because the projection structure (the convex portion 5C) is provided in the metal case 5, and the pressure in the vertical direction is dispersed with respect to the thermal conduction sheet 3. Since the projection structure generates a local deformation and the crack mentioned above in the inner portion of the thermal conduction sheet 3 in some pressurizing condition, it is possible to effectively reduce the mechanical stress.

As mentioned above, on the basis of the concavo-convex structure (the concave portions 5A and 5B and the convex portions 5C) of the metal case 5, it is possible to relax the mechanical stress applied to the semiconductor package 2 via the thermal conduction sheet 3, even in the case that the thermal conduction sheet 3 is pressurized by the metal case 5. Further, since it is possible to relax the mechanical stress applied to the printed circuit board 1 and the mechanical stress applied to the electronic parts mounted on the printed circuit board 1, it is possible to suppress a deterioration of a reliability of the electronic parts.

Further, since the concavo-convex structure (the concave portions 5A and 5B and the convex portions 5C) is provided in the metal case 5, an area of the contact portion between the metal case 5 and the thermal conduction sheet 3 is expanded in the light of the thermal conduction in the interface between the metal case 5 and the thermal conduction sheet 3. Therefore, it is possible to achieve an improvement of the thermal conductivity.

It should be further understood by those skilled in the art that the foregoing description has been made on embodiments of the invention and that various changes and modifications may be made in the invention without departing from the spirit of the invention and the scope of the appended claims.

For example, in the embodiment mentioned above, the description is given of the case that the leading end of the projection portion of the metal case coming into contact with the thermal conduction sheet is provided with two kinds of concave portions having the relatively deeper concave portions and the relatively shallower concave portions, however, the kind of the concave portions is not limited to two kinds, but three or more kinds of concave portions may be provided by further setting the concave portions having different depths.

The semiconductor device in accordance with the present invention can be applied to the semiconductor device having the heat radiating structure such as the optical transmitter and receiver (the optical transmission module).

The invention claimed is:

1. A semiconductor device comprising:
   a mounting board;
   a semiconductor package mounted on said mounting board;
   a metal case accommodating and fixing said mounting board and said semiconductor package in an inner portion; and a thermal conduction sheet arranged between said semiconductor package and said metal case, coming into contact with said semiconductor package and said metal case, and radiating a heat generated from said semiconductor package, wherein said thermal conduction sheet has an elasticity by which a stress is relaxed with time with respect to a pressure, wherein said metal case is provided with a plurality of concave portions and convex portions in a contact portion with said thermal conduction sheet, wherein said plurality of concave portions are formed at two or more different depths, and wherein said plurality of convex portions are sharp at acute angles toward said thermal conduction sheet in leading ends of said plurality of convex portions.

2. A semiconductor device as claimed in claim 1, wherein said plurality of convex portions are sharp toward said thermal conduction sheet.

3. A semiconductor device as claimed in claim 1, wherein said plurality of concave portions include a first concave portion having a first depth and a second concave portion having a second depth which is deeper than said first depth, a part or less of said metal case comes into contact with said thermal conduction sheet within said second concave portion, and an air gap is formed between said metal case and said thermal conduction sheet.

4. A semiconductor device as claimed in claim 3, wherein said second concave portion is formed as a groove shape and extends to an outer periphery of said contact portion between said metal case and said thermal conduction sheet, and said air gap is communicated with an external atmospheric air of said contact portion between said metal case and said thermal conduction sheet.

5. A semiconductor device as claimed in claim 3, wherein said first concave portion and said second concave portion are formed along said contact portion between said metal case and said thermal conduction sheet, and said second concave portion is formed at least in one of a bottom portion of said first concave portion and a portion between said two first concave portions.

* * * * *